US006425111B1

(12) United States Patent
del Mar Hershenson

(10) Patent No.: US 6,425,111 B1
(45) Date of Patent: Jul. 23, 2002

(54) SATURATION REGION TRANSISTOR MODELING FOR GEOMETRIC PROGRAMMING

(75) Inventor: Maria del Mar Hershenson, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/475,733

(22) Filed: Dec. 30, 1999

(51) Int. Cl.[7] ........................... G06F 17/50; G06F 17/17
(52) U.S. Cl. ............................. 716/4; 702/58; 702/109; 702/118; 703/2; 703/14
(58) Field of Search ..................... 716/1–21; 703/2–5, 703/13–20; 702/1–199

(56) References Cited

U.S. PATENT DOCUMENTS

| | | | | |
|---|---|---|---|---|
| 4,520,448 A | * | 5/1985 | Tremintin | 716/19 |
| 5,467,291 A | * | 11/1995 | Fan et al. | 703/14 |
| 5,568,395 A | * | 10/1996 | Huang | 716/4 |
| 5,615,377 A | * | 3/1997 | Shimizu et al. | 703/13 |
| 5,648,920 A | * | 7/1997 | Duvvury et al. | 716/20 |
| 5,699,264 A | * | 12/1997 | Nakamura et al. | 716/6 |
| 5,751,593 A | * | 5/1998 | Pullela et al. | 716/6 |
| 5,761,481 A | * | 6/1998 | Kadoch et al. | 703/2 |
| 5,949,694 A | * | 9/1999 | Amerasekera et al. | 716/5 |
| 6,066,177 A | * | 5/2000 | Hatsuda | 703/19 |
| 6,266,629 B1 | * | 7/2001 | Mallavarpu et al. | 703/13 |
| 6,269,277 B1 | * | 7/2001 | Hershenson et al. | 700/97 |
| 6,278,964 B1 | * | 8/2001 | Fang et al. | 703/19 |

OTHER PUBLICATIONS

Katto ("Device parameter extraction in the linear region of MOSFET's", IEEE Electron Device Letters, vol. 18, No. 9, Sep. 1997, pp. 408–410).*

Gomez et al. ("A nonlinear macromodel for CMOS OTAs", 1995 IEEE International Symposium on Circuits and Systems, vol. 2, Apr. 28, 1995, pp. 920–923).*

Sancheti et al. ("Layout optimization using arbitrarily high degree posynomial models", 1995 IEEE International Symposium on Circuits and Systems, vol. 1, Apr. 28, 1995, pp. 53–56).*

Sun et al. ("Fast timing simulation for submicron hot–carrier degradation", Proceedings of 33rd Annual IEEE International Reliability Physics Symposium, Apr. 4, 1995, pp. 65–71).*

Goossens et al. ("An automatic biasing scheme for tracing arbitrarily shaped I–V curves", IEEE Transactions on Computer–Aided Design of Integrated Circuits and Systems, vol. 13, No. 3, Mar. 1994, pp. 310–317.*

Jun et al. ("Piecewise polynomial models for MOSFET DC characteristics with continuous first order derivative", IEE Proceedings of Circuits Devices and Systems, vol. 135, No. 6, Dec. 1988, pp. 241–246.*

O'Callaghan et al. ("A large signal nonlinear MODFET model from small signal S–parameters", IEEE MTT–S International Microwave Symposium Digest, vol. 1, Jun. 13, 1989, pp. 347–350.*

(List continued on next page.)

*Primary Examiner*—Matthew Smith
*Assistant Examiner*—Phallaka Kik
(74) *Attorney, Agent, or Firm*—Blakely, Sokoloff, Taylor & Zafman LLP

(57) ABSTRACT

A method for providing a mathematical expression representing the operation of a field-effect transistor in its saturation region is disclosed. Data representing the operation of the transistor is divided into data segments with a monomial function fitted to each of the segments. The data segments are selected for a particular operating parameter such as transconductance based on knowledge of the transistor operation. The error at the transition from one function to another is checked and the data segments redivided to minimize the error. The resulting expression lends itself to global solution with geometric programs.

14 Claims, 3 Drawing Sheets

OTHER PUBLICATIONS

Masuda et al. ("A submicrometer MOS transistor I–V model for circuit simulation", IEEE Transactions on Computer–Aided Design of Integrated Circuits and Systems, vol. 10, No. 2, Feb. 1991, pp. 161–170.*

Xi et al. ("A new physical I–V model of deep–submicron FD SOI MOSFETs for analogue/digital circuit simulation", IEEE Proceedings of the 5th International Conference on Solid–State and Integrated Circuit Technology, Oct. 21, 1998, pp. 435–438).*

Cunha et al. ("An MOS transistor model for analog circuit design", IEEE Journal of Solid–State Circuits, vol. 33, No. 10, Oct. 1998, pp. 1510–1519).*

NN75032905 ("Three Device FET Diagnostic Testing Scheme", IBM Technical Disclosure Bulletin, vol. 17, No. 10, Mar. 1975, pp. 2905–2907 (3 pages)).*

NN76091441 ("Simulation Model for Field Effect Transistors", IBM Technical Disclosure Bulletin, vol. 19, No. 4, Sep. 1976, pp. 1441–1443 (5 pages)).*

* cited by examiner $$\log \frac{1}{g_m} = \text{MAX}\,[f_1, f_2, f_3]$$

| SELECT | | | | | SPICE OR MEASURE | | | |
|---|---|---|---|---|---|---|---|---|
| $V_{gs}$ | W | L | N | $V_{DS}$ | $g_m$ | $g_d$ | $I_D$ | $V_{gov}$ |
| 1.8 | 50 | 1 | 1 | 1.8 | — | — | — | — |
| 1.8 | 100 | 1 | 1 | 1.8 | — | — | — | — |
| 1.8 | 50 | 0.5 | 2 | 1.8 | — | — | — | — |
| 1.8 | 100 | 0.5 | 2 | 1.8 | — | — | — | — |
| 1.8 | 50 | 0.25 | 3 | 1.8 | — | — | — | — |
| 1.8 | 100 | 0.25 | 3 | 1.8 | — | — | — | — |

SATURATION REGION OPERATION

SATURATION REGION TRANSISTOR MODELING FOR GEOMETRIC PROGRAMMING

BACKGROUND OF THE DISCLOSURE

1. Field of the Invention

The invention relates to the field of modeling field-effect transistors.

2. Prior Art

There is a growing need to provide optimal designs for integrated circuits particularly as the critical dimensions decrease and speed of such circuits increase.

A relatively recent development in mathematics has provided an improved computerated tool for designing integrated circuits using geometric programs. In general, an operating model is developed in the form of a posynomial function. The geometric program once in the form of a convex program can be solved with efficient interior-point methods. The most important feature of geometric programs is that they can be globally solved with great efficiency. The algorithm determines whether the problem is infeasible (i.e., no design can meet all constraints). Also, the starting point of an optimization algorithm does not have any affect on the solution.

One interior-point method is described by K. O. Kortanek, X. Xu, and Y. Ye, "An Infeasible Interior-point Algorithm for Solving Primal and Dual Geometric Programs," MathProgramming, 76:155–181, 1996. This method has the desirable feature of exploiting sparsity in the problem, (i.e., efficiently handling problems in which each variable appears in only a few constraints). Additional methods of solving geometric programs are described in: Y. Nesterov and A. Nemirovsky, "Interior-Point Polynomial Methods in Convex Programming," Volume 13 of *Studies in Applied Mathematics*, SIAM, Philadelphia, Pa., 1994; and A. Fiacco and G. McCormick, *NonlinearProgramming: Sequential Unconstrained Minimization Technologies*, Wiley 1968 (Reprinted in SIAM Classics in Applied Mathematics series 1990).

The present invention is directed towards obtaining a posynomial expression for field-effect transistor model when operating in its saturation region. While numerous techniques are well known for obtaining mathematical expressions representing transistor characteristics including the operation of a transistor in its saturation region, these approaches do not necessarily lead to a posynomial expression useful in a geometric program.

The use of posynomial and monomial expression for circuits and their solution with geometric programs is discussed in Ser. No. 09/123,129, filed Jul. 27, 1998, entitled "System and Method for Designing Integrated Circuits," now U.S. Pat. No. 6,269,277 and Ser. No. 09/335,227, filed Jun. 17, 1999, entitled "Optimal Design of an Inductor and Inductor Circuit"; now U.S. Pat. No. 6,311,145, both assigned to the assignee of this application.

SUMMARY OF THE INVENTION

A method for representing the operation of a field-effect transistor in its saturation region as a posynomial function is described. Data is provided for a plurality of parameters representing the operation of the transistor in its saturation region. The data is divided into data segments each having a range. This range is determined by a characteristic represented by one or more other variables. For example, in connection with transconductance a field characteristic ($\theta$) is used. A monomial function is fitted to the operating parameter for each of the data segments. Now the error is determined at the transition from one function to the next. If this error exceeds a predetermined or desirable error then the data segments are adjusted to minimize error or additional data segments are included. The maximum value of the functions define the posynomial expression for the operating parameter.

DETAILED DESCRIPTION OF THE INVENTION

A method for modeling the saturation region of a field-effect transistor is described. In the following description, specific operating parameters, transistor characteristics and other details are set forth in order to provide a thorough understanding of the present invention. It will be apparent that the present invention may be used without these specific details. Additionally well-known mathematical concepts have not been described in detail in order not to unnecessarily obscure the present invention.

Figure 1:
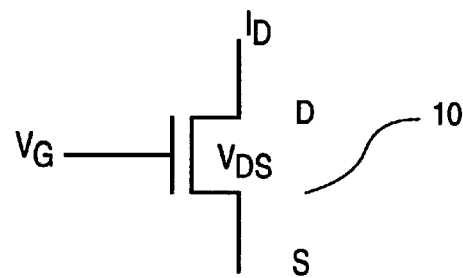
FIG. 1 illustrates a field-effect transistor and is used to identify several of the terms discussed in the present application.

In FIG. 1 a typical MOS field-effect transistor 10 is illustrated. It comprises a source and drain region and a gate. Such transistors are well-known in the art and are widely used in most modern microprocessors. Typical variables defining the operation of such transistors include the drain-to-source, potential ($V_{DS}$), the gate overdrive potential, ($V_{gov}$), and the drain current ($I_D$). ($V_{gov}$ is defined as the gate-to-source voltage less the voltage threshold of the transistor.)

Figure 2:
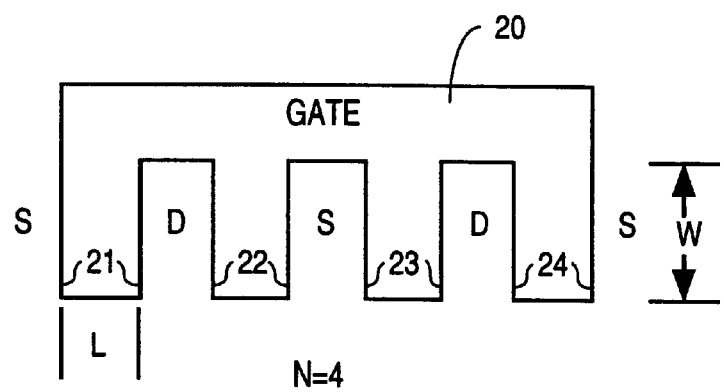
FIG. 2 is a plain view of a transistor used to illustrates the fingers of a gate.

In the plain view of FIG. 2 a gate 20 for a field-effect transistor is illustrated. This gate includes four fingers 21, 22, 23 and 24 each of which extends over a channel region defined by a source and drain region. As used in the present application this transistor is said to have four fingers (N=4). The channel length "L" for the transistor is illustrated in FIG. 2. This length is not necessarily equal to the effective length of the gate since some under diffusion occurs beneath the gate and the effective channel length maybe somewhat less than the physical gate length. Each of the channels also has a width "W" also illustrated in FIG. 2.

Figures 4, 5:
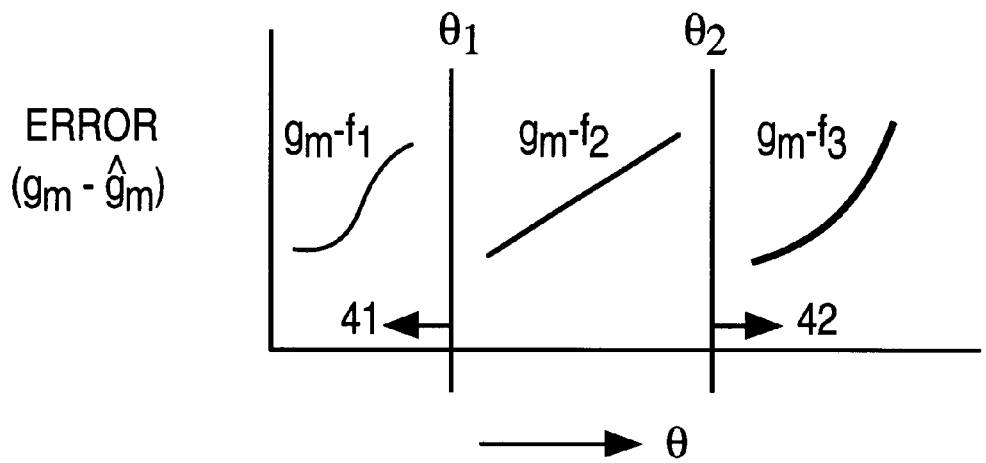
FIG. 4 is graph used to illustrate the error at the transition from one function to the next.
FIG. 5 is a table illustrating data used for modeling the saturation region of a transistor.
Figure 6:
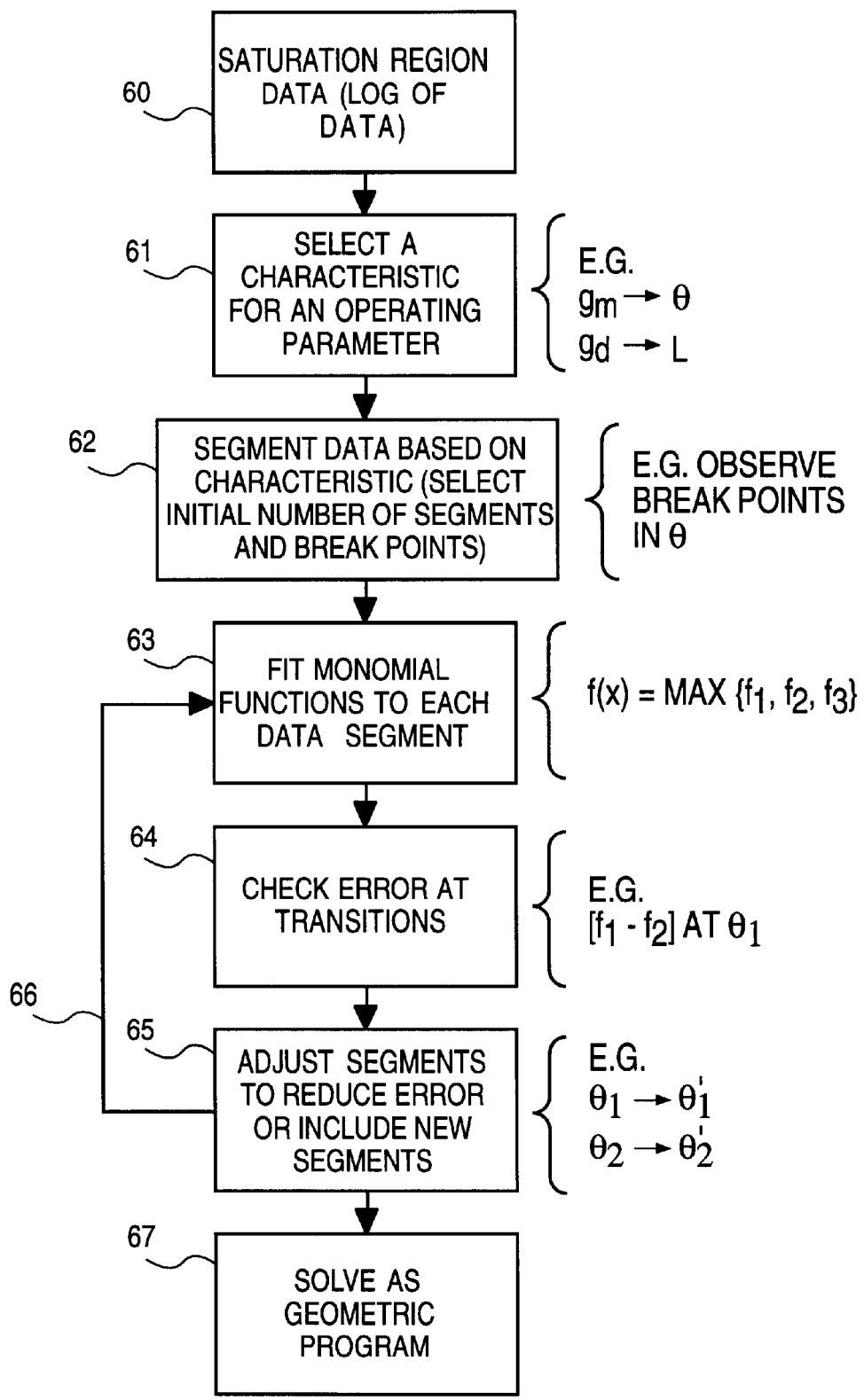
FIG. 6 illustrates the method of the present invention.

To begin it is necessary to have data representing the operation of a transistor in its saturation region as shown by step 60 in FIG. 6. A typical table is illustrated in FIG. 5 with nine variables, specifically gate width, gate length, number of fingers, drain-to-source voltage, transconductance ($g_m$), output conductance ($g_d$), drain current, gate-to-source voltage, and gate overdrive voltage. Other variables maybe selected where appropriate. In the currently preferred embodiment the log of the data is used.

The variables W, L, N, $V_{gs}$ and $V_{DS}$ are typically selectable by a designer. The variables $g_n$, $g_d$ and $I_D$ are process depended in addition to their dependency on the other variables shown in FIG. 5. Data for these operating parameters can be provided by either actual measurements or from modeling such as with SPICE. Generally as shown in FIG. 5 the variables W and L are confined to a grid system and only dimensions falling on the grid system are used.

Assume a solution is sought for one of the operating parameters $g_m$, $g_d$ or $I_D$. A characteristic or variable of the transistor is selected which highlights or substantially controls the selected operating parameter as shown by steps 61. As will be seen this will allow the data of FIG. 5 to be segmented for fitting by monomial functions.

For transconductance the characteristic θ is selected in the currently preferred embodiment. This characteristic is derived from equation (1) below:

$$I_D = K \frac{NW}{L} V_{gov}^2 \quad (1)$$

where K is a constant.

Rewriting this equation as equation (2) below:

$$\frac{I_D}{N \cdot W \cdot L} = K \frac{V_{gov}^2}{L^2} = \theta \quad (2)$$

illustrates that the voltage per unit length (squared) is a field measurement. The transconductance can be observed conveniently through θ. The "break points" in θ can be observed and by this observation allow the data to be segregated based on the ratio of $I_D$ to N, W, L. Based on this ratio the data is segmented into for instance three data segments. This is shown by step 62 of FIG. 6. The determination of the break points as mentioned is done through observation and is heuristic as will be seen.

In the currently preferred embodiment for $g_d$, "L" is used as the characteristic and for $V_{gov}$, θ is again used.

Figure 3:
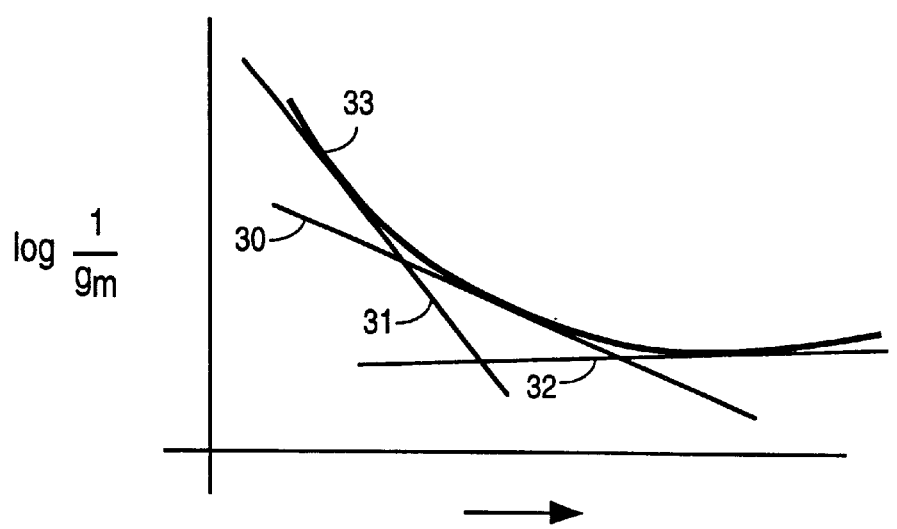
FIG. 3 is a graph used to illustrate piecemeal data fitting for the operating parameter of transconductance.

Now as shown by step 63 monomial functions are fitted to each of the data segments. This is shown in a somewhat simplistic form in FIG. 3 where curve 33 represents the log of the receptacle of transconductance plotted against the other variables. Three lines 30, 31 and 32 are used to approximate in a piecemeal fashion the curve 33. As can be seen in FIG. 3 the maximum value of line 31 ($f_1$), line 30 ($f_2$), and line 32 ($f_3$) is used to define the transconductance. (In the preferred embodiment the receptacle of the transconductance is used as the operating parameter.)

One method for fitting curves known in the prior art is discussed below.

Assume it is necessary to approximate a function f(x) by a monomial function $\hat{f}(x)$, where x is a vector of n real positive variables.

$$\hat{f}(x) = \beta x_1^{\alpha_1} x_2^{\alpha_2} \ldots x_n^{\alpha_n} \quad (3)$$

where $\alpha_1, \alpha_2, \ldots \alpha_n \in R$ and $\beta \in R^+$ are the function parameters. At first sight, this may seem a complicated nonlinear problem. However, this fitting problem becomes a linear problem with a simple change of variables. First take the logarithm of both sides of equation (3) to obtain, $$\log \hat{f}(x) = \beta + \alpha_1 \log x_1 + \alpha_2 \log x_2 + \ldots + \alpha_n \log x_n.$$

Defining $\alpha_0 = \log \beta$, this takes the form of $$\log \hat{f}(x) = [\,1 \;\; \log x_1 \;\; \log x_2 \;\; \ldots \;\; \log x_n\,] \begin{bmatrix} \alpha_0 \\ \alpha_1 \\ \alpha_2 \\ \vdots \\ \alpha_4 \end{bmatrix} \quad (4)$$

which is a linear function of the new parameters $y = (\alpha_0, \ldots, \alpha_4)$.

If m sample points of f(x) are used the problem consists in finding a value y such that $f \approx \hat{f}$, $$z = \begin{bmatrix} \log f_1 \\ \vdots \\ \log f_m \end{bmatrix} \approx \begin{bmatrix} \log \hat{f}_1 \\ \vdots \\ \log \hat{f}_m \end{bmatrix} = \begin{bmatrix} 1 & \log x_{11} & \ldots & \log x_{1n} \\ \vdots & \vdots & \vdots & \vdots \\ 1 & \log x_{1m} & \ldots & \log x_{1m} \end{bmatrix} \begin{bmatrix} \beta_0 \\ \beta_1 \\ \beta_2 \\ \beta_3 \\ \beta_4 \end{bmatrix} \quad (5)$$

$$= Ay.$$

To find an appropriate value for y, minimize the p-norm of the error.

$$\text{minimize} \|z - Ay\|_p.$$

Minimizing the p-norm of the error is a convex problem and can be readily solved. The error distribution depends on the norm chosen. A small p puts more weight on the small errors and a large p puts more weight on the large errors.

Now described are the details for minimizing the 2-norm and the ∞norm. To minimize 2-norm, solve a least-squares problem, i.e., take $y = (A^T A)^{-1} A^T z$, where A is the m×n matrix in the equation (5).

It is important to realize that this choice of y yields the best fit for log f(x) not for f(x). In other words, minimize $\|\log f - \log \hat{f}\|_2$, instead of $\|\log f - \log \hat{f}\|_2$ results. It is interesting to see how these two fitting criteria are related. Minimize, $$J = \sum_{i=1}^{m} (\log \hat{f}_i - \log f_i)^2 = \sum_{i=1}^{m} (\log(\hat{f}_i / f_i))^2.$$

For a near 1 log $a \approx a - 1$ is obtained. Assuming the fit is good (i.e., (i.e., $(\hat{f}_i / f_i)) \approx 1$, one can approximate $$J \approx \sum_{i=1}^{m} (\hat{f}_i / f_i) - 1)^2 = \sum_{i=1}^{m} \left( \frac{\hat{f}_i - L_i}{f_i} \right)^2 = (1/100)^2 \sum_{i=1}^{m} e_i^2,$$

where $e_i$ is the square of the percent error for the ith sample. In other words, if the fit is good, the criterion used is quite close to the sum of the squares of the percent errors.

One can also minimize $\|z - Ay\|_\infty$, i.e., $$\text{minimize}_i |\hat{f}_i - f_i|.$$

This minimization problem can be written as a linear program, minimize u such that $$\log f_i - (\alpha_0 + \alpha_1 \log x_{1i} + \ldots + \alpha_n \log x_{ni}) \leq u \; i=1, \ldots, m, \log$$
$$f_i - (\alpha_0 + \alpha_1 \log x_{1i} + \ldots + \alpha_n \log x_{ni}) \geq -u \; i=1, \ldots, m. \quad (6)$$

Again, by solving (6), minimizing the maximum error occurs for the fit of log f(x) not for f(x), $$J = \max_i |\log \hat{f}_i - \log f_i| = \max_i |\log \hat{f}_i / f_i|.$$

By taking the same approximation as before (i.e., for $a \approx a-1$, $\log a \approx a-1$) the following can be within, $$J \approx \max_i |\hat{f}_i / f_i - 1| = \max_i \left| \frac{\hat{f}_i - L_i}{f_i} \right| = (1/100)|e_i|.$$

If the fit is good, the criterion used is effective to minimize the maximum absolute percent error.

For a matrix of size 1,000,000×6, the linear problem is solved using MATLAB in approximately forty seconds real time on an ULTRA SPARC1 running at 170 MHz. The computation time scales linearly with the problem size, i.e., problem of size 2,000,000×6, takes around eighty seconds.

Now that the operating parameters such as $g_m$ is defined in terms of the functions $f_1$, $f_2$ and $f_3$, it may be that at the transitions say between $f_1$ and $f_2$ or $f_2$ and $f_3$ a large amount of error exists. This is shown graphically in FIG. 4 for the transconductance. At $\theta_1$ (the value of $\theta$ selected for transitioning between a first function and a second function) the value for $f_1$ is found as well as the value for $f_2$. As shown in FIG. 4 there may be considerable error between the function $f_1$ at $\theta_1$ and the function $f_2$ at $\theta_1$. If the error $(g_m - f_1)$ at $\theta_1$ is relatively large compared to the error $(g_m - f_2)$ at $\theta_1$, moving $\theta_1$, in the direction indicated by arrow 41 in FIG. 4 may minimize the error. Similarly it may occur that by examining error at $\theta_2$, the error can be reduced by moving $\theta_2$ in the direction indicated by arrow 42. Thus the data segments can be redivided and if the error is high, say above some predetermined value, then the segments are adjusted so as to minimize the error and new monomial functions are fitted to the new data segments. Sometimes it is required to add new segments. This is shown by steps 64 and 65 in FIG. 6 ($\theta_1$ is adjusted to $\theta_1^1$ and $\theta_2$ to $\theta_2^1$).

When new segments are obtained new monomial functions are fitted as shown by line 66. After step 63 is repeated the error is again checked as shown by step 64. If the error is within an acceptable level then steps 65 is skipped. The process of adjusting of the break points for the selected characteristic is repeated until the error is within an acceptable level. Note that for the example above $\theta$ is adjusted. This occurs both for the transconductance and for the gate overdrive voltage. For the output conductance "L" is changed to minimize error at the transition for the currently preferred embodiment.

Finally as shown by step 67 of FIG. 6 the expression representing the operating parameters such as transconductance is solved as a geometric program. Thus a method for representing the saturation region of a field-effect transistor has been disclosed which lends itself to a model that can be used to formulate circuit design problems as geometric programs.

I claim:

1. A method for enabling integrated circuit design, comprising:
    representing a field-effect transistor operation in its saturation region as posynomial expressions comprising:
        providing data for a plurality of variables representing the operation of the transistor in its saturation region;
        dividing the data into data segments;
        fitting a monomial function to each data segment;
        checking error occurring at transitions from one function to another; and
        combining each fitted function corresponding to each data segment to produce the posynomial expression.

2. The method defined by claim 1, wherein the dividing step comprises:
    selecting a characteristic of the transistor represented by one or more of the plurality of variables; and
    examining the characteristic to select data segments.

3. The method defined by claim 2, wherein a log of the data is used in the providing step.

4. The method defined by claim 3, wherein the variables included channel length, channel-width, drain current, drain-to-source voltage, transconductance, a number representing the number of channel regions, gate overdrive voltage and output conductance.

5. The method defined by claim 2, wherein the expression represents the reciprocal of transconductance, the characteristic is represented by $$\theta = \frac{I_D}{N * W * L}$$

when N is a number of channels, $I_D$ is a drain current, W is a channel width, and L is a channel length.

6. The method defined by claim 2, wherein the expression represents output conductance and the characteristic is the channel length.

7. The method defined by claim 2, wherein the expression represents overdrive voltage and the characteristic is represented by $$\frac{I_D}{N * W * L}$$

where $I_D$ is to source to a drain current, N is a number of channel regions, W is a width of each channel, and L is a length of each channel.

8. The method defined by claim 1, further comprising:
    repeating the steps of dividing and fitting if the error is larger than a predetermined amount.

9. The method defined by claim 1, wherein additional data segments are added if error is large.

10. A method of representing an operating parameter of a field-effect transistor in its saturation region by a posynomial expression comprises:
    providing data representing the operation of the transistor in its saturation region for a plurality of variables;
    dividing the data into a plurality of data segments based on ranges of a characteristic represented by one or more of the variables;
    fitting a monomial function to the data for each of the segments;
    determining error occurring at transitions from one function to another function;
    repeating the dividing step so as to reduce the error; and
    using a maximum value of each function to define the posynomial expression for the operating parameter.

11. The method defined by claim 10, wherein a log of the data is used in the providing step.

12. The method defined by claim 10, wherein the operating parameter is transconductance and the characteristic is derived from the variables of drain current, channel width and length and a number representing the number of channels.

13. The method defined by claim 10, wherein the operating parameter is output conductance and the characteristic is channel length.

14. The method defined by claim 10, wherein the operating parameter is overdrive voltage and the characteristic is derived from the variables of drain current, channel width and length and a number representing the number of channels.

* * * * *